United States Patent
Song et al.

(10) Patent No.: US 9,245,878 B2
(45) Date of Patent: Jan. 26, 2016

(54) BIDIRECTIONAL DUAL-SCR CIRCUIT FOR ESD PROTECTION

(71) Applicant: Taiwan Semiconductor Manufacturing Co., Ltd., Hsin-Chu (TW)

(72) Inventors: Ming-Hsiang Song, Shin-Chu (TW); Jam-Wem Lee, Zhubei (TW); Tzu-Heng Chang, New Taipei (TW); Yu-Ying Hsu, Pingzhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/251,670

(22) Filed: Apr. 14, 2014

(65) Prior Publication Data

US 2014/0217461 A1    Aug. 7, 2014

Related U.S. Application Data

(62) Division of application No. 13/176,780, filed on Jul. 6, 2011, now Pat. No. 8,759,871.

(51) Int. Cl.
*H01L 23/62* (2006.01)
*H01L 27/02* (2006.01)

(52) U.S. Cl.
CPC .................................. *H01L 27/0262* (2013.01)

(58) Field of Classification Search
CPC ............... H01L 27/0262; H01L 27/02; H01L 2921/0002; H01L 27/0259; H01L 29/7436; H01L 29/87; H01L 2924/00
USPC .......... 257/172, 173, 355, 356–363, E29.014, 257/E29.015, E29.016, E29.181, 255
See application file for complete search history.

(56) References Cited

U.S. PATENT DOCUMENTS

| | | | |
|---|---|---|---|
| 5,140,401 A | 8/1992 | Ker et al. | |
| 5,717,559 A * | 2/1998 | Narita | H01L 27/0255 361/111 |
| 6,521,952 B1 * | 2/2003 | Ker | H01L 27/0262 257/141 |
| 6,538,266 B2 | 3/2003 | Lee et al. | |
| 6,576,958 B2 * | 6/2003 | Ker | H01L 27/0255 257/355 |
| 7,138,686 B1 * | 11/2006 | Banerjee | H01L 23/552 257/371 |
| 7,285,458 B2 | 10/2007 | Manna et al. | |
| 7,542,253 B2 | 6/2009 | Ker et al. | |
| 7,563,653 B2 | 7/2009 | Lee et al. | |
| 7,777,277 B2 | 8/2010 | Hung | |
| 2002/0050615 A1 * | 5/2002 | Ker et al. | 257/355 |
| 2002/0056876 A1 * | 5/2002 | Schroeder et al. | 257/355 |
| 2002/0122280 A1 | 9/2002 | Ker et al. | |
| 2010/0103570 A1 * | 4/2010 | Song et al. | 361/56 |
| 2010/0232077 A1 * | 9/2010 | Worley | H01L 27/0255 361/56 |
| 2010/0244094 A1 | 9/2010 | Hung | |

FOREIGN PATENT DOCUMENTS

WO    0014803 A1    3/2000

OTHER PUBLICATIONS

Cao, S. et al., "Design and Characterization of ESD Protection Devices for High-Speed I/O in Advanced SOI Technology", IEEE Transactions on Electron Devices, Mar. 2010, 57(3):644-653.
Mergens, M. et al., "Diode-Triggered SCR (DTSCR) for RF-ESD Protection of BiCMOS SiGe HBTs and CMOS Ultra-Thin Gate Oxides", IEEE International Electron Devices Meeting, 2003, IEDM '03 Technical Digest, 4 pages.
Ker, M.D. et al., "SCR Device Fabridated with Dummy-Gate Structure to Improve Turn-On Speed for Effective ESD Protection in CMOS Technology", IEEE Transactions on Semiconductor Manufacturing, May 2005, 18(2):320-327.
Rusu, A. et al., "Gate-Controlled Diode—A New Way for Electronic Circuits", Proceedings of the Romanian Academy, Series A, The Publishing House of the Romanian Academy, 10(3/2009):1-6.
* cited by examiner

*Primary Examiner* — Yosef Gebreyesus
(74) *Attorney, Agent, or Firm* — Duane Morris LLP

(57) ABSTRACT

An ESD protection circuit includes at least a first and a second silicon controlled rectifier (SCR) circuits. The first SCR circuit is coupled between the pad and the positive power supply terminal. The second SCR circuit is coupled between the pad and the ground terminal. At least one of the SCR circuits is configured to selectively provide a short or relatively conductive electrical path between the pad and one of the positive power supply terminal and the ground terminal.

16 Claims, 8 Drawing Sheets

US 9,245,878 B2

BIDIRECTIONAL DUAL-SCR CIRCUIT FOR ESD PROTECTION

PRIORITY CLAIM AND CROSS-REFERENCE

This application is a divisional of U.S. patent application Ser. No. 13/176,780, filed Jul. 6, 2011, which application is expressly incorporated by reference herein in its entirety.

BACKGROUND

In integrated circuits, electrostatic discharge (ESD) stress events may arise when a charged object, such as a human body or another machine, is placed in proximity to an integrated circuit device and a static discharge occurs. The conductive leads on a packaged integrated circuit (IC) constitute an efficient surface for receiving electrostatic discharge. If the voltage stress that is caused by the discharge into an IC pin is not protected against, physical damage including breakdown, metal electromigration, gate oxide rupture and other damage due to an ESD stress may destroy or damage the physical devices within the integrated circuit.

Prior art ESD protection approaches involve a variety of circuit elements that are associated with the pads of the integrated circuit. Typically, a bond wire couples the input/output pad, which is a metallic or conductive surface, to a package pin. The pins may be gold, copper, palladium and nickel plated material or the like. The ESD protection circuit provides a path to a safe terminal, typically a power supply pin or ground pin, and causes the electro-static current (called a "strike") to bypass the susceptible semiconductor devices formed within the integrated circuit. An effective ESD circuit can protect a device and prolong its life.

The level of ESD protection needed for integrated circuits varies widely depending on the application and the type of integrated circuits. Circuits intended for use in automobile applications require particularly robust ESD protection. Similarly, integrated circuits that are intended to be handled by a consumer, such as flash cards and DIMM modules that a consumer physically inserts into a board or slot are particularly vulnerable to human body ESD strikes. In contrast, circuits that are installed into a robust circuit board inside a factory setting and placed on a well protected system in a highly controlled environment may require far less robust ESD protection. The work stations, workers, and the tools used in such an environment can be strapped to a ground terminal, and the humidity and materials used in the environment can be controlled to lower the probability of a static discharge event. In some cases, this protection may lower the ESD probability to a level such that on-board protection circuitry may not be required. This is a rare case, however, and most integrated circuits have some on-board ESD circuitry.

The electronics industry has created standards and classes for ESD ratings of devices, so that the purchasers of an integrated circuit may know what level of protection or class of ESD event the integrated circuit is designed for. These may be described as classes of protection for a human body model (HBM) event, for example. Class 0 may be for events from 0-2 kilovolts, Class 1 may be from 2 kilovolts to 4 kilovolts, Class 2 may be for greater than 4 kilovolts. Machine model (MM) events are also specified. This information is typically provided by an IC manufacturer so that the buyer understands what ESD stresses the device typically can withstand. Another test framework known as the charged device model (CDM) has been gaining popularity recently for ESD testing because it provides a more practical real world ESD test. The CDM simulates what happens when an IC, in an automated manufacturing environment, becomes electrically charged (e.g., by coming into contact with another material and then being separated from that other material) and then discharges due to contact or proximity with a conductor referenced to another potential or to ground.

ESD events typically happen between an input, input/output or output pad and another terminal, either VSS (ground) and VDD (positive power supply). Four modes of ESD stress are commonly described. A positive voltage from a pad to VSS may be referred to as a PS strike, a positive voltage from a pad to VDD may be referred to as a PD strike, a negative voltage from a pad to VSS may be referred to as an NS strike, and a negative voltage from a pad to VDD may be referred to as a ND strike. These terms for ESD stress modes are used herein.

ESD circuits have used silicon controlled rectifier (SCR) structures previously to provide a current path. SCR devices are known in the art to be formed from p-n-p-n or n-p-n-p junctions. Once an SCR device is triggered, it will continue to conduct current so long as an adequate hold current is present, and the low on-resistance $R_{on}$ for SCR devices and low triggering voltage renders SCR devices particularly useful in ESD protection circuits.

A challenge associated with the use of SCR structures as ESD clamps has been the relatively low turn-on speed (i.e., relatively long turn-on time) provided by such an approach, which has resulted in low CDM performance. The CDM discharge is a fast transient pulse, which may occur over several nanoseconds as an upper limit. Turn-on efficiency is therefore a factor that impacts ESD performance, e.g., for CDM testing.

SUMMARY

In some embodiments, an electrostatic discharge (ESD) protection structure includes first and second semiconductor structures, an RC power clamp circuit, and at least one gated diode. The first semiconductor structure includes a first semiconductor substrate of a first conductivity type, a first well of the first conductivity type formed into the first semiconductor substrate, and a second well of a second conductivity type formed into the first semiconductor substrate adjacent to the first well. The conductivity types can be P or N type. An intersection of the first and second wells forms a p-n junction. The first semiconductor structure also includes a first diffused region of the first conductivity type formed at the surface of the second well and electrically coupled to a positive power supply terminal, a second diffused region of the second conductivity type formed at the surface of the first well and electrically coupled to a pad terminal, and a third diffused region of the first conductivity type formed at the surface of the first well and electrically coupled to a ground terminal. The second semiconductor structure includes a second semiconductor substrate of the first conductivity type, a third well of the first conductivity type formed into the second semiconductor substrate, and a fourth well of the second conductivity type formed into the second semiconductor substrate adjacent to the first well. An intersection of the first and second wells forms a p-n junction. The second semiconductor structure also includes a fourth diffused region of the second conductivity type formed at the surface of the fourth well and electrically coupled to the positive power supply terminal, a fifth diffused region of the first conductivity type formed at the surface of the fourth well and electrically coupled to the pad terminal, and a sixth diffused region of the second conductivity type formed at the surface of the third well and electrically coupled to the ground terminal. The RC power clamp circuit is coupled between the positive power supply terminal and the ground terminal. The gated diode(s) is configured to selectively provide an electrical path between two of the diffused regions in one of the wells.

In some embodiments, an electrostatic discharge (ESD) protection structure includes first and second semiconductor structures, an RC power clamp circuit, and at least one conductor. The first semiconductor structure includes a first semiconductor substrate of a first conductivity type, a first well of the first conductivity type formed into the first semiconductor substrate, and a second well of a second conductivity type formed into the first semiconductor substrate adjacent to the first well. An intersection of the first and second wells forms a p-n junction. The first semiconductor structure also includes a first diffused region of the first conductivity type formed at the surface of the second well and electrically coupled to a positive power supply terminal, a second diffused region of the second conductivity type formed at the surface of the first well and electrically coupled to a pad terminal, and a third diffused region of the first conductivity type formed at the surface of the first well and electrically coupled to a ground terminal. The second semiconductor structure includes a second semiconductor substrate of the first conductivity type, a third well of the first conductivity type formed into the second semiconductor substrate, and a fourth well of the second conductivity type formed into the second semiconductor substrate adjacent to the first well. An intersection of the first and second wells forms a p-n junction. The second semiconductor structure also includes a fourth diffused region of the second conductivity type formed at the surface of the fourth well and electrically coupled to the positive power supply terminal, a fifth diffused region of the first conductivity type formed at the surface of the fourth well and electrically coupled to the pad terminal, and a sixth diffused region of the second conductivity type formed at the surface of the third well and electrically coupled to the ground terminal. The RC power clamp circuit is coupled between the positive power supply terminal and the ground terminal. The conductor(s) is configured to selectively provide an electrical path at least partially between one of the diffused regions of the first conductivity type, formed at the surface of one of the wells of the second conductivity type, and one of the diffused regions of the second conductivity type, formed at the surface of one of the wells of the first conductivity type, via the one well of the first conductivity type and the one well of the second conductivity type.

In some embodiments, an electrostatic discharge (ESD) protection circuit includes a conductive pad of an integrated circuit, typically a contact pad, with circuitry coupled to the pad for buffering data, an RC power clamp circuit on the integrated circuit, and first and second silicon controlled rectifier (SCR) circuits. The RC power clamp is coupled between a positive power supply terminal and a ground terminal. The first SCR circuit is coupled between the pad and the positive power supply terminal. The first SCR circuit has a first trigger input coupled to the RC power clamp circuit. The second SCR circuit is coupled between the pad and the ground terminal. The second SCR circuit has a second trigger input coupled to the RC power clamp circuit. At least one of the SCR circuits includes a gated diode configured to selectively provide an electrical path between the pad and either the positive power supply terminal or the ground terminal.

In some embodiments, an electrostatic discharge (ESD) protection circuit includes a pad of an integrated circuit, circuitry coupled to the pad for buffering data, an RC power clamp on the integrated circuit, and first and second silicon controlled rectifier (SCR) circuits. The RC power clamp is coupled between a positive power supply terminal and a ground terminal. The first SCR circuit is coupled between the pad and the positive power supply terminal. The first SCR circuit has a first trigger input coupled to the RC power clamp circuit. The second SCR circuit is coupled between the pad and the ground terminal. The second SCR circuit has a second trigger input coupled to the RC power clamp circuit. At least one of the SCR circuits includes a conductor configured to selectively provide an electrical path at least partially between the pad and one of the positive power supply terminal and the ground terminal. The electrical path is a p-n-p, n-p-n, or p-n-p-n path.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description.

Figure 1A:
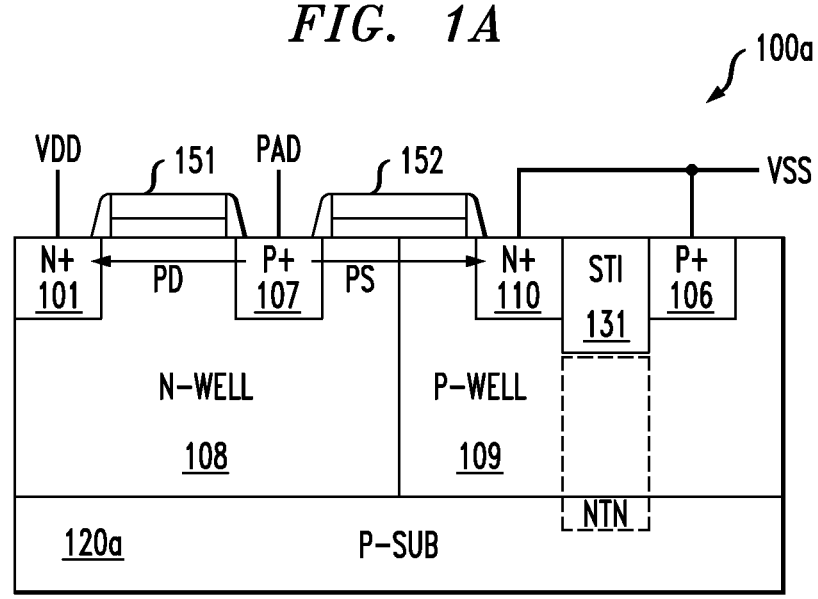
FIGS. 1A-1H illustrate cross-sectional views in accordance with some embodiments.
Figure 1B:
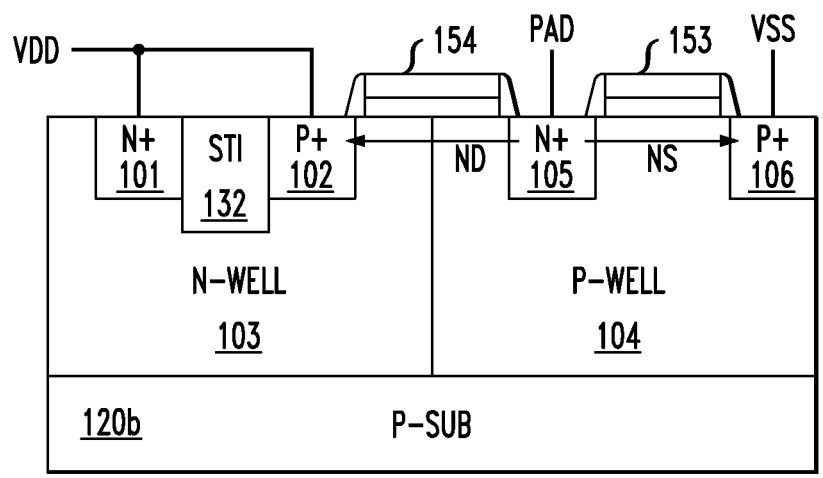

FIGS. 1A and 1B illustrate cross-sectional views of semiconductor structures 100a and 100b that may form part of an electrostatic discharge (ESD) protection structure in some embodiments. The cross-sections of semiconductor structures 100a and 100b are first described below, and then the relationship between the structures and a circuit representation is described further below.

Referring to FIG. 1A, semiconductor structure 100a includes a semiconductor substrate 120a of a first conductivity type. The first conductivity type may be a P-type or an N-type; a P-type substrate P-SUB is shown in FIG. 1A as an example. A well 109 of the first conductivity type (e.g., P-well in FIG. 1A) is formed into substrate 120a. This well is referred to in the description below as a P-well, although it is understood that in other examples of opposite polarities, the well may be an N-well. A well 108 of a second conductivity type (e.g., N-type or P-type; FIG. 1A shows N-type) is formed into substrate 120a adjacent to P-well 109. An intersection of P-well 109 and N-well 108 forms a p-n junction. P-well 109 and N-well 108 may be formed using any of several known semiconductor fabrication techniques. These may be doped regions, or the N region may be doped and the P-well may be undoped P semiconductor substrate material. The wells may be deposited or grown in an epitaxial process. Thermal diffusion and/or ion implantation may be used to form the wells as is known in the art. SOI techniques may also form N and P-wells as shown.

A diffused region (diffusion) 101, which may be an N+ diffusion, is formed at the surface of N-well 108 and is electrically coupled to a positive power supply terminal (e.g., VDD). A diffusion 107, which may be a P+ diffusion, is formed at the surface of N-well 108 and is electrically coupled to an input/output (I/O) pad terminal denoted PAD. Diffusions 110 and 106, which may be N+ and P+ diffusions, respectively, are formed at the surface of P-well 109 and are electrically coupled to a ground terminal (e.g., VSS). An isolation region 131, which may be a shallow trench isolation (STI), a LOCOS (local oxidation of silicon) isolation region, or another isolation region, is formed in P-well 109 as shown, separating diffusions 110 and 106. Isolation region 131 may be formed above a non-n-well, non-p-well, bulk material denoted NTN, which is a native device implant block layer that is used to increase the well resistance. Such a bulk material is described at U.S. Pat. No. 7,777,585 to Sonntag. A similar bulk material may be present below comparable isolation regions of FIGS. 1C, 1E, and/or 1G, but is not shown for graphical convenience only. Use of the NTN bulk material improves (reduces) SCR turn-on time. With the NTN layer, the well resistance is increased, causing the trigger current of the SCR to be reduced. Thus, the turn-on time of the SCR is reduced.

A gated diode 151 is configured to selectively provide an electrical path between N+ regions 101 and P+ region 107. A conductor 152 is configured to selectively provide an electrical path at least partially between P+ region 107 and N+ region 110, via N-well 108 and P-well 109. FIG. 1A shows an example in which conductor 152 is configured to selectively provide an electrical path between P+ region 107 and N+ region 110, and FIG. 1G shows an example in which a similar conductor 152' provides a partial electrical path between P+ region 107 and N+ region 110.

For a positive strike from the terminal PAD to the VSS terminal, the arrow labeled "PS" depicts the path from P+ diffusion 107, to N-well 108, into P-well 109, and to the N+ diffusion 110 that is coupled to VSS. This path PS, which is a p-n-p-n path that is characteristic of a silicon controlled rectifier (SCR), is effectuated by conductor 152 when the voltage is high enough to turn on the SCR.

For a positive strike with respect to the VDD terminal, the arrow labeled "PD" depicts the path from P+ diffusion 107, to N-well 108, to the N+ diffusion 101 that is coupled to VDD. This path PD, which is a p-n path, is effectuated by gated diode 151 when the voltage exceeds the diode's forward bias (turn-on) voltage.

Referring to FIG. 1B, semiconductor structure 100b includes a semiconductor substrate 120b of the first conductivity type. This substrate is shown as P-SUB in FIG. 1B and may be the same as substrate 120a of FIG. 1A. A well 104 of the first conductivity type (e.g., P-type as in FIG. 1B) is formed into substrate 120b. A well 103 of the second conductivity type (e.g., N-type) is formed into substrate 120b adjacent to P-well 104. An intersection of P-well 104 and N-well 103 forms a p-n junction. A diffusion 106, which may be a P+ diffusion, is formed at the surface of P-well 104 and is electrically coupled to VSS. A diffusion 105, which may be an N+ diffusion, is formed at the surface of P-well 104 and is electrically coupled to PAD. Diffusions 101 and 102, which may be N+ and P+ diffusions, respectively, are formed at the surface of N-well 103 and are electrically coupled to VDD. An isolation region 132, which may be an STI or other isolation region, is disposed between diffusions 101 and 102.

A gated diode 153 is configured to selectively provide an electrical path between N+ regions 105 and P+ region 106. A conductor 154 is configured to selectively provide an electrical path at least partially between P+ region 102 and N+ region 105, via N-well 103 and P-well 104. FIG. 1B shows an example in which conductor 154 is configured to selectively provide an electrical path between P+ region 102 and N+ region 105, and FIG. 1H shows an example in which a similar conductor 154' provides a partial electrical path between P+ region 102 and N+ region 105.

For a negative strike from the terminal PAD to the VSS terminal, the arrow labeled "NS" depicts the path from N+ diffusion 105, to P-well 104, to the P+ diffusion 106 that is coupled to VSS. This path NS, which is an n-p path, is effectuated by gated diode 153 when the voltage exceeds the diode's forward bias voltage.

For a negative strike from the terminal PAD to the VDD terminal, the arrow labeled "ND" depicts the path from N+ diffusion 105, to P-well 104, into N-well 103, and to the P+ diffusion 102 that is coupled to VDD. This path ND, which is an n-p-n-p path that is characteristic of an SCR, is effectuated by conductor 154 when the voltage is high enough to turn on the SCR.

Thus, embodiments of the present disclosure provide discharge pathways for the four ESD stress modes PS, PD, NS, and ND, thereby providing bidirectional ESD protection using a dual SCR configuration. According to one aspect, the disclosed embodiments are characterized by particularly high speed (fast) turn-on during the onset of a strike event. Relatively faster turn-on is enabled by providing certain current pathways that are more direct (shorter) than current pathways that might otherwise be provided. For example, prior art techniques employ isolation regions (e.g., shallow trench isolation "STI" regions) in places where the present embodiments comprise gated diodes 151 and 153 and conductors 152 and 154 at the surface of the corresponding wells. Such STI regions in conventional approaches effectively cause current paths to traverse a more circuitous route that ventures down into the corresponding well to pass around the isolation region. The embodiments of the present disclosure are configured to enable operation with shorter and more direct current paths from point to point, as opposed to proceeding around an obstructing isolation region. The shorter current path enables faster turn-on of the SCR for improved CDM performance. This short path includes the path along which the strike current is sinked.

In various embodiments, one or more of gated diode 151, conductor 152, conductor 154, and gated diode 153 is provided in place of (i.e., instead of) an STI region. Providing at least one gated diode or at least one conductor in place of an STI region is for the purpose of providing a current path that becomes conductive during turn-on, along a short ESD current path. The various combinations may be understood with the following notational convention. For each of the gated diodes or conductors 151, 152, 153, and 154, a binary '1' denotes that the corresponding gated diode or conductor is provided (is present), and a binary '0' denotes that an STI region is provided instead of that gated diode or conductor. Thus, a four-bit code XYZW may categorize certain alternative embodiments, where X represents presence of 151, Y represents presence of 152, Z represents presence of 154, and W represents presence of 153. FIGS. 1A and 1B correspond to the code 1111, because gated diode 151, conductor 152, conductor 154, and gated diode 153 are all present.

Figure 1C:
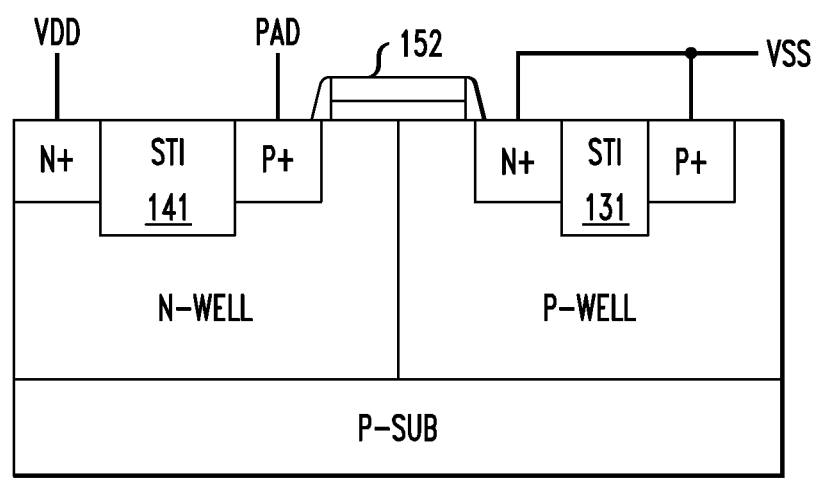
Figure 1D:
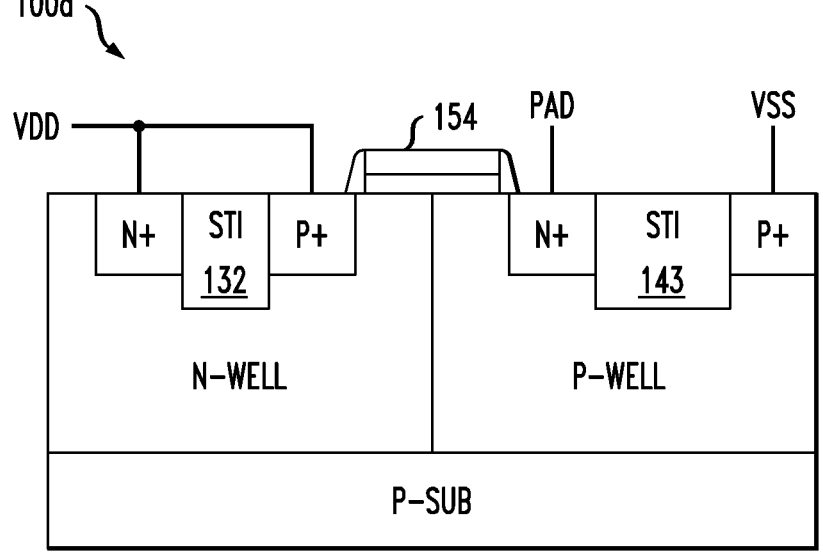
Figure 1E:
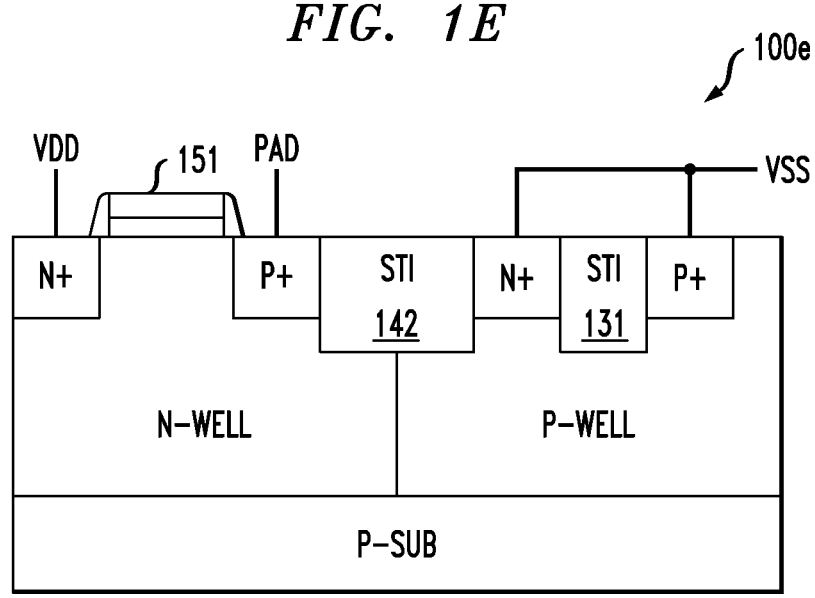
Figure 1F:
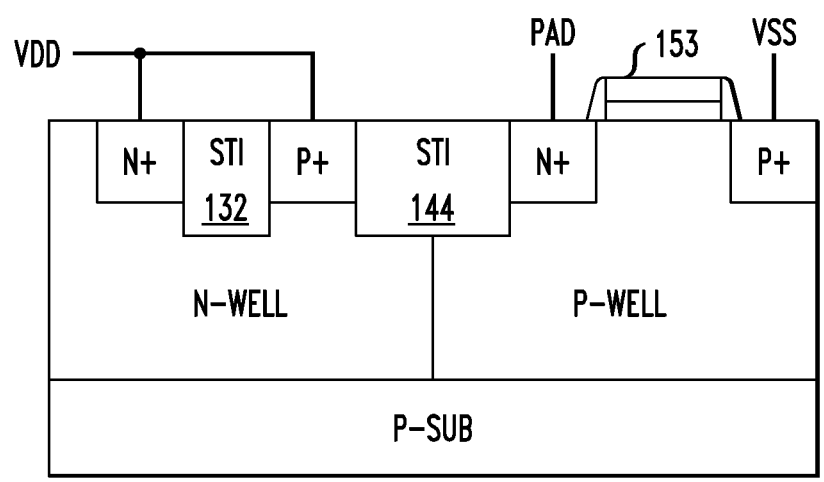
Figure 1G:
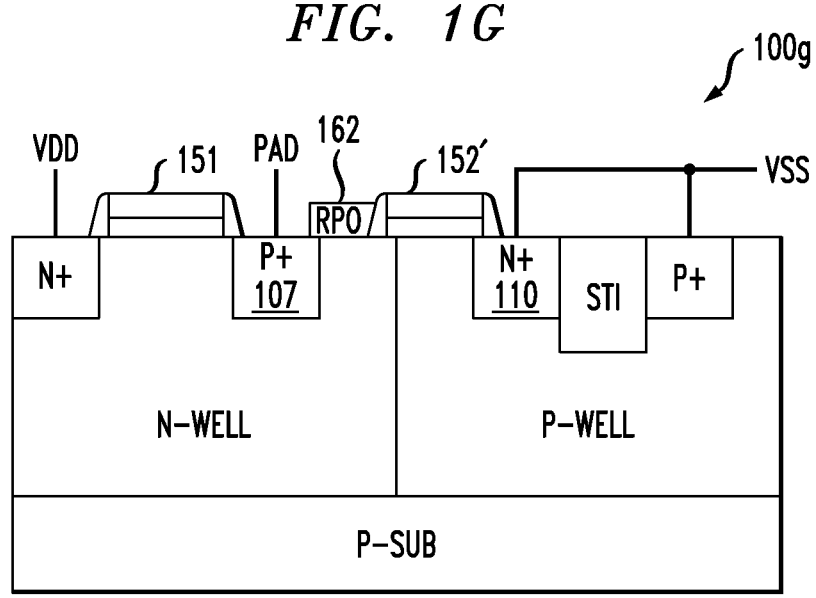
Figure 1H:
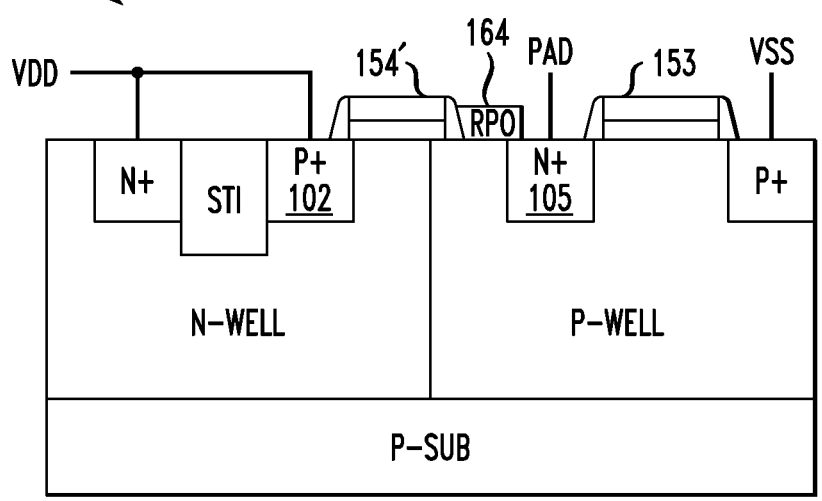

FIGS. 1C and 1D correspond to the code 0110, because STI 141 is provided instead of gated diode 151, and STI 143 is provided instead of gated diode 153. Current travels a longer distance (relative to the situation in FIGS. 1A and 1B) for the PD and NS modes in this case, in order to travel around STI regions 141 and 143, respectively. FIGS. 1E and 1F correspond to the code 1001, because STI 142 is provided instead of conductor 152, and STI 144 is provided instead of conductor 154. Current travels a longer distance (relative to the situation in FIGS. 1A and 1B) for the PS and ND modes in this case, in order to travel around STI regions 142 and 144, respectively. In FIGS. 1C-1F, the substrates, wells, and diffusions are the same as in FIGS. 1A-1B, with the changes being in the replacement of some gated diodes or conductors with STI regions, so some reference characters are omitted in FIGS. 1C-1F for graphical convenience only.

Thus, various combinations of gated diode/conductor or STI may be used, with semiconductor configurations corresponding to codes 0001 through 1111 (i.e., counting up in binary from 0001 to 1111) in various embodiments. In contrast, a conventional configuration might correspond to code 0000, with relatively long paths used for all four ESD modes PS, PD, NS, and ND.

Gated diodes 151 and 153 and conductors 152 and 154 may be configured in various ways (denoted options I-IV) as shown in Tables 1A-1B.

TABLE 1A

Configuration options for gated diode 151 and conductor 152

| | Gated diode 151 | | Conductor 152 | | |
|---|---|---|---|---|---|
| Option | Material | Bias | Material | Bias (ESD) | Bias (Normal operation) | RPO |
| I | P-gated diode | Float | N-PO or high-k | VSS | VSS | no |
| II | P-gated diode | Float | N-PO or high-k | VSS | VDD | yes |
| III | P-gated diode | Float | N-PO or high-k | Float | Float | yes |
| IV | P-gated diode | Float | P-PO or high-k | VSS | VDD | yes |

TABLE 1B

Configuration options for gated diode 153 and conductor 154

| | Gated diode 153 | | Conductor 154 | | |
|---|---|---|---|---|---|
| Option | Material | Bias | Material | Bias (ESD) | Bias (Normal operation) | RPO |
| I | N-gated diode | Float | P-PO or high-k | VDD | VDD | no |
| II | N-gated diode | Float | P-PO or high-k | VDD | VSS | yes |
| III | N-gated diode | Float | P-PO or high-k | Float | Float | yes |
| IV | N-gated diode | Float | N-PO or high-k | VDD | VSS | yes |

Figure 2A:
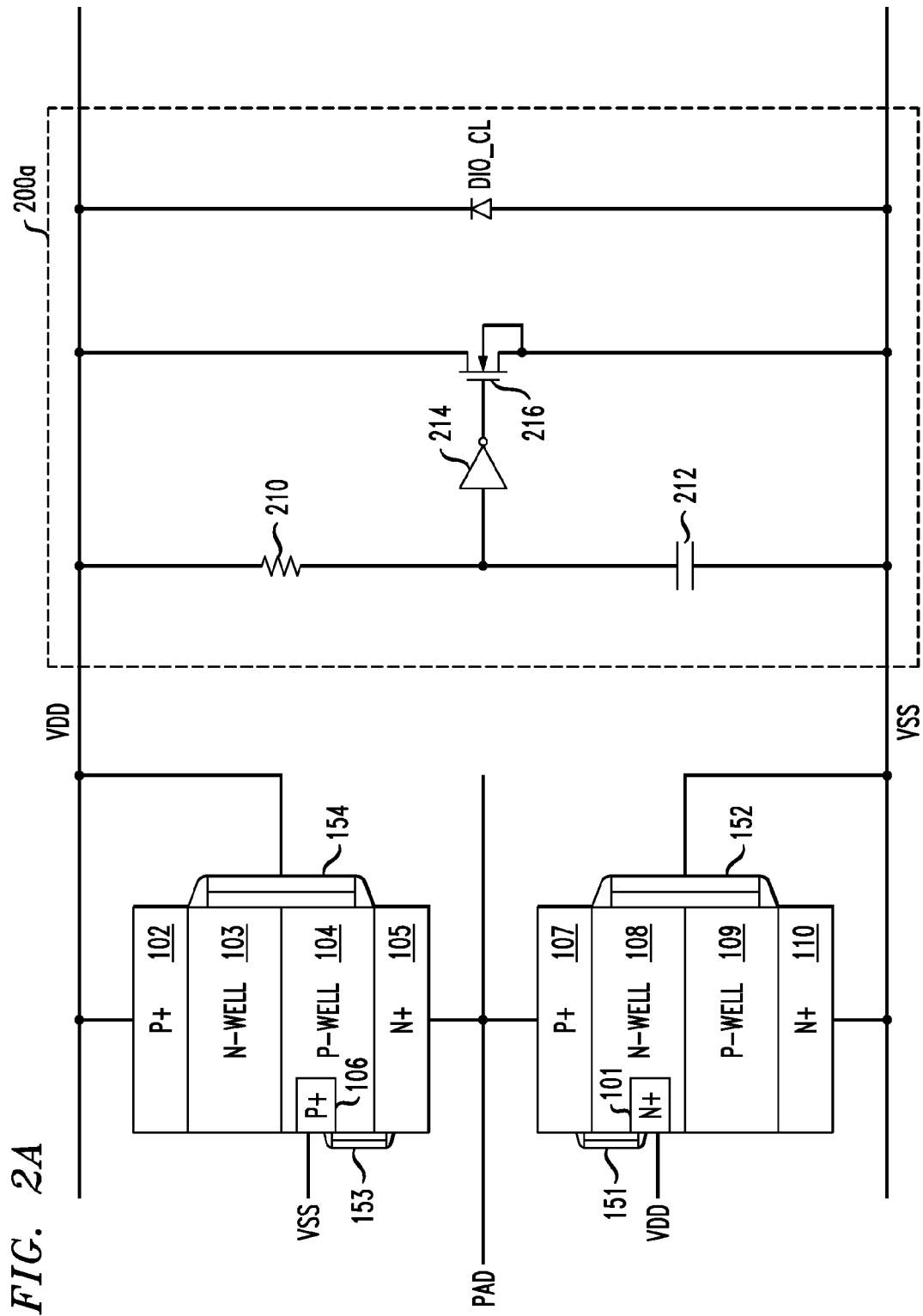
FIGS. 2A-C illustrate relationships between semiconductor structures and RC power clamps in accordance with some embodiments.

In option I, which is illustrated by FIG. 2A, gated diode 151 may be of the first conductivity type (e.g., P-type), and gated diode 153 may be of the second conductivity type (e.g., N-type). These gated diodes may be formed without a lightly doped drain (LDD). Without an LDD, capacitance is less, and turn-on time may be reduced. Gated diodes 151 and 153 may be made electrically floating, which also reduces capacitance and thus may reduce turn-on time. Conductors 152 and 154 may be formed from polycrystalline silicon (also known as polysilicon, denoted PO in Tables 1A-1B) or a high-k material. As known in the art, "high-k" stands for high dielectric constant, which is a measure of how much charge a material can hold. High-k materials are generally defined as materials having a dielectric constant (k) higher than that of silicon dioxide, which has a dielectric constant of 3.9. In option I, conductor 152 may be an N-type implant (thus "N-PO" in Table 1A), and conductor 154 may be a P-type implant ("P-PO").

RC power clamp 200a can be a known type of power clamp comprising resistor 210, capacitor 212, inverter 214 and field effect transistor (FET) 216. Power clamp 200a is coupled between VDD and VSS. An exemplary such power clamp is described in U.S. Pat. Pub. No. 20100103570 to Song et al., e.g., at FIG. 4 therein. Referring to FIG. 2A of the present disclosure, power clamp 200a provides ESD protection between the power supply terminals VSS and VDD. Inverter 214 will turn on FET 216 during a positive event from VDD to VSS, providing a path for current to flow and protecting sensitive circuitry that might otherwise be damaged. The resistance for resistor 210 and capacitance for capacitor 212 are chosen to cause FET 216 to turn on for an appropriate ESD event, but also chosen to try and keep it from turning on during normal switching operations. Diode Dio_CL provides a path from VSS to VDD for a negative voltage ESD strike between the power supplies.

Figure 2B:
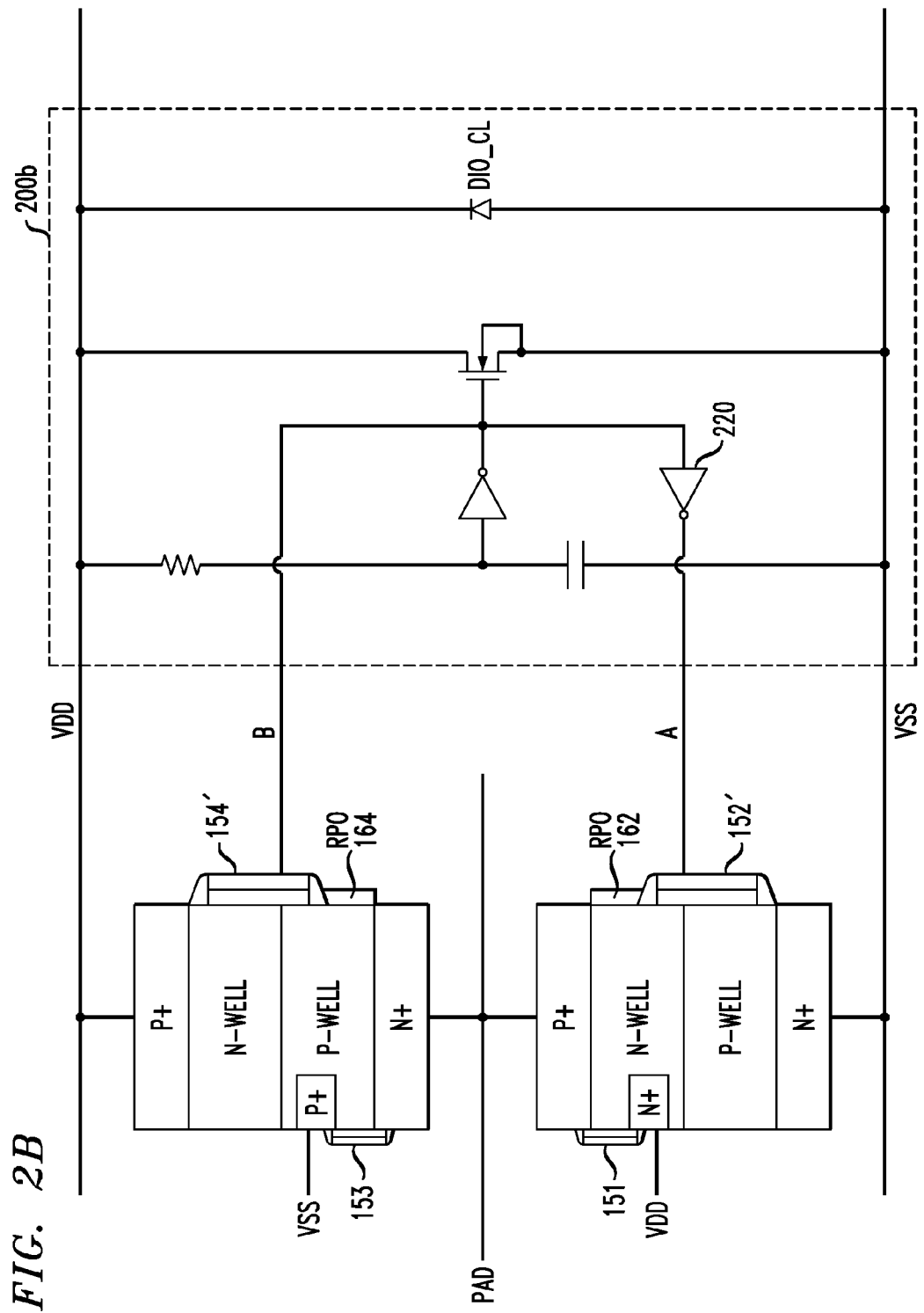

In option II, which is illustrated by FIG. 2B, conductors 152' and 154' are coupled to nodes A and B, respectively, which are maintained at opposite polarities by inverter 220 of power clamp 200b. The charging of the RC detector at the input to the power clamp inverter 214 distinguishes an ESD event from operational signal rise times. Inverter 220 forces both the pull-up and pull-down SCRs into the required state. FIG. 2B is otherwise similar to FIG. 2A and does not require further description.

Figure 2C:
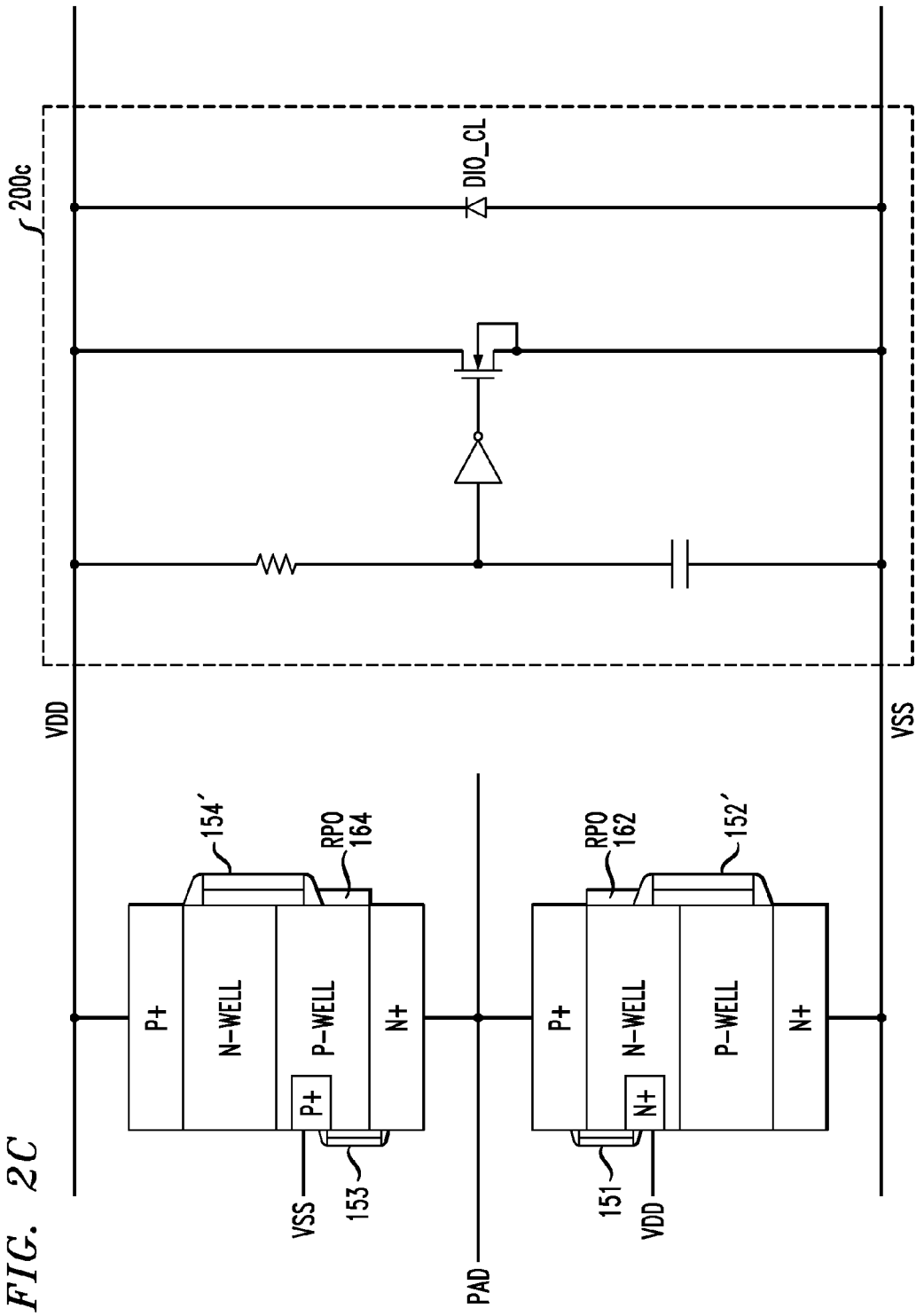

In option III, which is illustrated by FIG. 2C, conductors 152' and 154' are electrically floating. The limited capacitance of a floating gate from either of conductors 152 and 154 to PAD is advantageous for high frequency applications. In many RF and switching applications, time intervals for charging capacitance through a resistance slows performance.>

Option IV, which is also illustrated by FIG. 2B, is similar in some respects to option II, except that the conductivity types of the implants for conductors 152' and 154' may be interchanged.

In each of options II, III, and IV, a resist protection oxide (RPO) layer (silicide block layer) may be used to shorten the discharge current path or to increase the conductivity of the discharge current path. For example, an RPO layer 162 may be used in conjunction with conductor 152', and an RPO layer 164 may be used in conjunction with conductor 154'. These RPO layers are also shown in the cross-section views of FIGS. 1G and 1H. One purpose of the RPO layer is to reduce leakage during standby conditions. With RPO, the channel current path is obstructed below conductor 152' and/or conductor 154'. For option I, a higher threshold voltage $V_{th}$ may reduce leakage, but charging the gate of the gated diode requires time.

An aspect of the circuit shown in FIG. 2B is that the trigger circuit (e.g., with an RC power clamp circuit) as in options II and IV is coupled to conductors 152' and 154'. Holding the pull-down SCR with the gate bias turned off during standby mode (i.e., absence of ESD event) accelerates turn-on speed during an ESD event while reducing current leakage in the standby mode.

The selective use of materials, dopings, and biases to gated diodes and/or conductors as in Tables 1A-1B affects standby current leakage (e.g., reduces the level of disadvantageous leakage in non-ESD scenarios in various embodiments), and timing. Use of dopings or using a high-k material can increase the switching threshold voltage of the parasitic metal oxide semiconductor (MOS) in the corresponding SCR structure to reduce standby current leakage.

Figure 3:
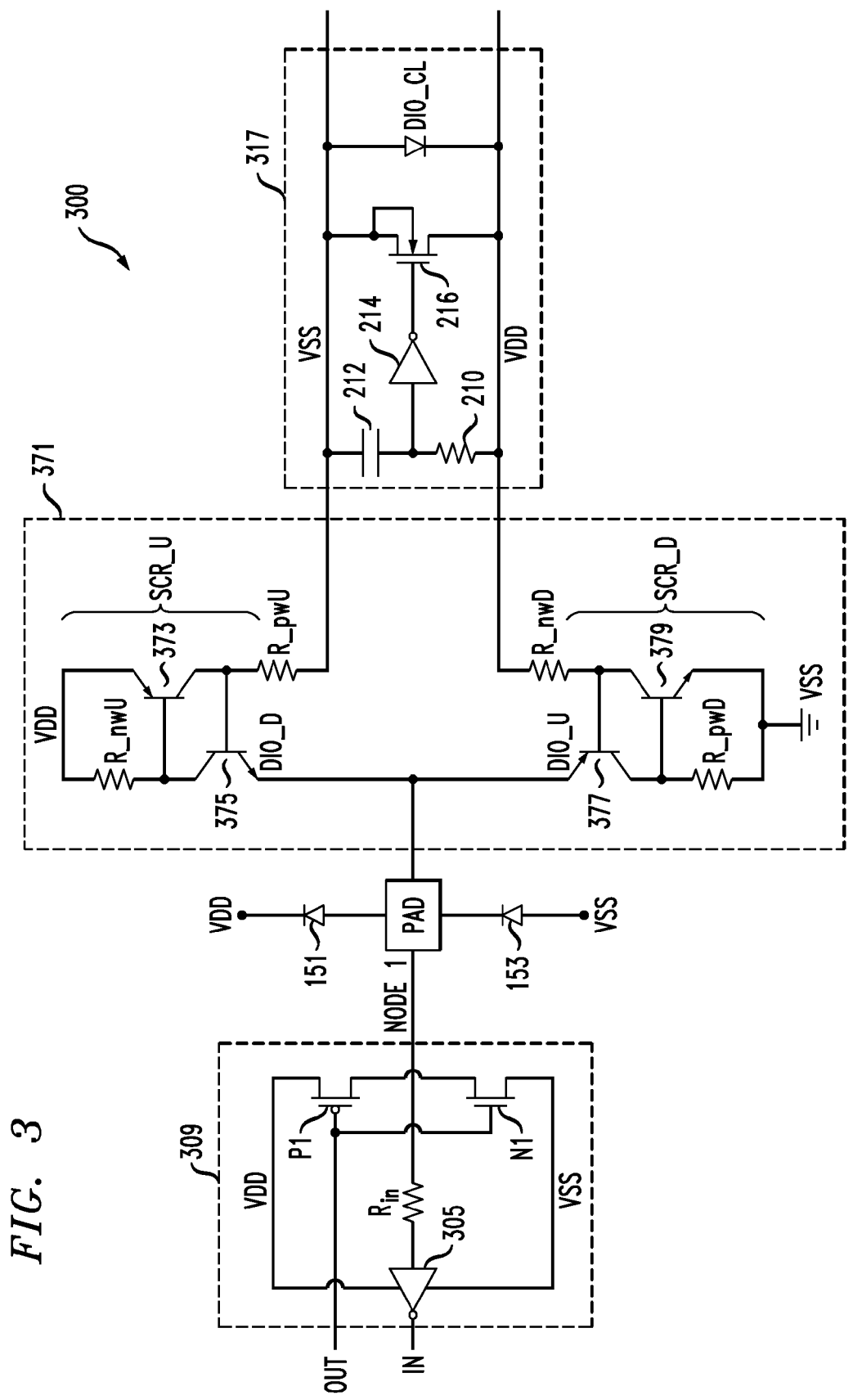
FIG. 3 is a circuit schematic in accordance with some embodiments.

FIG. 3 is a circuit diagram depicting an illustrative exemplary embodiment of an ESD circuit. FIG. 3 provides a circuit equivalent of the semiconductor structures of FIGS. 1A-1B.

In FIG. 3, a victim circuit (e.g., an input output buffer) 309 is coupled to the PAD terminal. Circuit 309 includes an input buffer 305 for supplying incoming data to the remaining circuitry, an output signal OUT coupled to a CMOS inverter of PMOS transistor P1 and NMOS transistor N1, input impedance Rin (which may be the parasitic or inherent impedance of the transistors that form buffer 305), and a node Node1 coupled to pad.

RC power clamp circuit 317 is provided to protect from strikes between VSS and VDD, and vice versa and has an inverter 214 and resistor 210 and capacitor 212 providing the input to the inverter to turn on the FET device 216 to provide a current path between these terminals during an ESD event. Similarly, diode Dio_CL provides a current path from VSS to VDD for a negative ESD strike between these terminals. Gated diodes 151 and 153 provide connections from PAD to VDD and VSS, respectively.

An ESD protection circuit 371 is also shown in FIG. 3. From PAD to VSS, p-n-p bipolar junction transistor (BJT) 377 is coupled to n-p-n BJT 379 to form an SCR device labeled SCR_D. This SCR may be referred to as a pull-down SCR because when conducting it clamps or pulls the voltage at PAD down to VSS. The p-n-p-n path of SCR_D may correspond to the p-n-p-n path PS of FIG. 1A. The p-n junction from the emitter to the base of p-n-p BJT 377 also provides a diode labeled Dio_U. The resistance in a P-well (e.g., P-well 109) for the n-p-n BJT 379 provides the bias resistor R_pwD for the base of BJT 379. P-n-p BJT 377 is coupled to complete the SCR_D. The N-well (e.g., N-well 108) resistance labeled R_nwD between the power clamp VDD and the base of BJT 377 provides the bias to the base of that transistor. The p-type emitter of transistor 377 couples SCR_D to the pad terminal PAD and provides a p-n diode between the PAD and VDD through the well resistor R_nwD.

A second SCR provides the upper ESD protection circuit, labeled SCR_U. Typically, functional devices between PAD and VDD are referred to as pull-up circuits, because when PAD is floating, such pull-up circuits may pull the PAD potential up to VDD. Therefore, an SCR (such as SCR_U) as in various embodiments that protects such a pull-up circuit is referred to as a "pull-up" SCR. An SCR such a SCR_D that protects a pull-down circuit likewise is referred to as a pull-down SCR. This SCR, which may correspond to the n-p-n-p path ND of FIG. 1B, is formed of the N-well (e.g., N-well 103) resistance R_nwU from VDD to the base of p-n-p BJT 373, n-p-n BJT 375 and the P-well (e.g., P-well 104) resistance R_pwU from the base of BJT 375 to voltage VSS. The p-n base-emitter junction of BJT 375 also forms a diode labeled Dio_D that is forward biased from VSS to the PAD terminal.

In FIG. 3, the ESD protection circuit 371 may be placed at each protected input, output or input/output pad for the integrated circuit. There may be dozens, or hundreds, of such pads. The power clamp circuit 317 is only placed in the integrated circuit once, or a few times at most. There is no trigger circuit required for each SCR and for each pad; instead, injection current into the wells is used with the RC power clamp circuit to forward bias a transistor during an ESD event, and trigger the SCR to conduct so as to protect the victim circuit.

Table 2 depicts, for each of the four modes of ESD strike described above, the primary and supporting current flow paths for the ESD protection circuit of FIG. 3.

TABLE 2

Primary and supporting current flow paths for ESD protection circuit

| ESD Mode | Main Path | Supporting Path |
| --- | --- | --- |
| PS | SCR_D | Dio_U + FET 216 |
| PD | Dio_U | SCR_D + Dio_CL |
| NS | DIO_D | Dio_CL + SCR_U |
| ND | SCR_U | FET 216 + Dio_D |

From Table 2, it can be seen that for an ESD mode PS event, a positive voltage from the PAD terminal to the VSS terminal, the main path is SCR_D. This means that the SCR_D, formed from BJTs 377 and 379 and the well resistors R_pwD and R_nwD as shown in FIG. 3 is triggered and conducts current away from the victim circuit. In the embodiment of FIG. 3, the triggering is done not by a trigger circuit, but instead by means of injection current flowing into wells. Therefore, when current is injected, all of the SCRs of all the protected PADs can become conductive at the same time. In this example, the PS event puts a positive voltage on the PAD with respect to VSS. The voltage at the pad will forward bias the p-n junction of the emitter of BJT 377 with respect to the base of BJT 377 and inject current into the N-well 108. In a PS ESD event, positive ESD current will inject into emitter/base junction of BJT 377 (Dio_U which now is forward biased). The VDD bus is then charged up and the RC power clamp is triggered on to provide a low resistance path to VSS to sustain the emitter/base current of BJT 377. As the ESD (emitter) current increases, significant hole current will flow into the collector (P-well) of BJT 377, which is also the base of BJT 379, then on to VSS through the resistor R_pwD. When the voltage drop of R_pwD exceeds the base/emitter voltage of BJT 379, BJT 379 will turn on. BJT 379 is then coupled with BJT 377 to form a low resistance p-n-p-n device (SCR D). This SCR device provides a direct current discharge path of positive ESD current from the pad to VSS.

Table 2 further describes that the supporting paths of Dio_U and the transistor 210 in the RC power clamp conduct current during the PS ESD mode event. This improves the effectiveness of the ESD protection by providing additional conductive paths away from the victim circuit coupled to the terminal PAD.

In Table 2, the next mode depicted is a PD event. In PD mode, a positive voltage from the pad to the VDD supply, the main path for current is the diode Dio_U. Referring to the circuit diagram of FIG. 3, in this mode the p-n junction of diode Dio_U is forward biased and there is a path from the base of BJT 377 through the N-well 108 to voltage VDD; thus a direct path is provided. In addition, SCR_D and the clamp diode Dio_CL provide supporting paths for current to flow. Regarding the supporting path, as the pad to VDD current flow increases, the base voltage of BJT 377 goes up and significant hole current flows into the collector of BJT 377 and turns on the SCR_D. A portion of ESD current will then flow from the pad to VSS through SCR_D, then to VDD through diode Dio_CL.

ESD events in mode NS, where there is a negative voltage on the PAD with respect to terminal VSS, are also described in Table 2. In this mode, the p-n junction of the base emitter of BJT 375 in FIG. 3, labeled Dio_D, is forward biased and provides a path back to VSS through a P-well (e.g., P-well 104) to the RC clamp circuit. The supporting paths of Dio_CL and SCR_U provide additional current paths to protect the victim circuit from the ESD current.

The bottom row of Table 2 depicts the paths for an ESD event in ND mode, or a negative voltage at the terminal PAD with respect to the positive voltage supply VDD. In this event, the upper SCR circuit SCR_U in FIG. 3 is triggered by current injection into the P-well 104 the n-p-n transistor is formed in, and there is a path through Dio_D and the transistor 210 that provides supporting paths for the ND event. The protection for ND mode is very similar to that of PS mode. In a ND mode event, negative current is injected to emitter/base of BJT 375. Negative voltage is developed at VSS. The RC power clamp is triggered on to sustain the current. As the negative current increases, significant electron current flows into the collector (N-well 103) of BJT 375, which is also the base of BJT 373, then on to VDD through resistor R_nwU. When the voltage drop of R_nwU exceeds the base/emitter voltage of BJT 373, BJT 373 will turn on. BJT 373 is coupled with BJT 375 to form a low resistance p-n-p-n device (SCR_U). This SCR device provides a direct discharge current path of negative ESD current from PAD to VSS.

Although examples are illustrated and described herein, embodiments are nevertheless not limited to the details shown, since various modifications and structural changes may be made therein by those of ordinary skill within the scope and range of equivalents of the claims. For example, conductivity types may be interchanged in the examples above, e.g., with P-type replacing all occurrences of N-type and N-type replacing all occurrences of P-type.

What is claimed is:

1. An electrostatic discharge (ESD) protection structure comprising:
   a first semiconductor structure comprising:
      a first semiconductor substrate of a first conductivity type,
      a first well of the first conductivity type formed into the first semiconductor substrate,
      a second well of a second conductivity type formed into the first semiconductor substrate adjacent to the first well, an intersection of the first and second wells forming a p-n junction,
      a first diffused region of the first conductivity type formed at the surface of the second well and electrically coupled to a positive power supply terminal,
      a second diffused region of the second conductivity type formed at the surface of the first well and electrically coupled to a pad terminal, and
      a third diffused region of the first conductivity type formed at the surface of the first well and electrically coupled to a ground terminal; and
   a second semiconductor structure comprising:
      a second semiconductor substrate of the first conductivity type,
      a third well of the first conductivity type formed into the second semiconductor substrate,
      a fourth well of the second conductivity type formed into the second semiconductor substrate adjacent to the third well, an intersection of the third and fourth wells forming a p-n junction,
      a fourth diffused region of the second conductivity type formed at the surface of the fourth well and electrically coupled to the positive power supply terminal,
      a fifth diffused region of the first conductivity type formed at the surface of the fourth well and electrically coupled to the pad terminal, and
      a sixth diffused region of the second conductivity type formed at the surface of the third well and electrically coupled to the ground terminal;
   a plurality of conductors configured to selectively provide an electrical path at least partially between one of the diffused regions of the first conductivity type, formed at the surface of one of the wells of the second conductivity type, and one of the diffused regions of the second conductivity type, formed at the surface of one of the wells of the first conductivity type, via said one well of the first conductivity type and said one well of the second conductivity type; and
   an inverter, wherein an input of the inverter is coupled to a first conductor of the conductors, and an output of the inverter is coupled to a second conductor of the conductors.

2. The ESD protection structure of claim 1, further comprising:
   an RC power clamp circuit coupled between the positive power supply terminal and the ground terminal.

3. The ESD protection structure of claim 1, further comprising:
   at least one gated diode configured to selectively provide an electrical path between two of the diffused regions in one of the wells.

4. The ESD protection structure of claim 1, wherein the at least one gated diode includes:
   a first gated diode configured to selectively provide an electrical path between the second diffused region and the third diffused region; and
   a second gated diode configured to selectively provide an electrical path between the fourth diffused region and the fifth diffused region.

5. The ESD protection structure of claim 1, wherein the first conductivity type is a p type.

6. The ESD protection structure of claim 1, wherein the second conductivity type is an n type.

7. The ESD protection structure of claim 1, wherein the at least one gated diode includes a gated diode configured to selectively provide an electrical path between the fourth diffused region and the fifth diffused region.

8. The ESD protection structure of claim 7, wherein the gated diode configured to selectively provide an electrical path between the fourth diffused region and the fifth diffused region is a gated diode of the first conductivity type.

9. The ESD protection structure of claim 1, wherein the at least one gated diode includes a gated diode configured to selectively provide an electrical path between the second diffused region and the third diffused region.

10. The ESD protection structure of claim 9, wherein the gated diode configured to selectively provide the electrical path between the second diffused region and the third diffused region is a gated diode of the second conductivity type.

11. The ESD protection structure of claim 1, wherein:
    the first conductor is configured to selectively provide an electrical path at least partially between the first diffused region and the second diffused region, via the first and second wells.

12. The ESD protection structure of claim 11, wherein:
    the second conductor is configured to selectively provide an electrical path at least partially between the fifth diffused region and the sixth diffused region, via the third and fourth wells.

13. The ESD protection structure of claim 1, wherein the first and second conductors are formed from polycrystalline silicon or a high-k material.

14. The ESD protection structure of claim 1, further including a resist protection oxide (RPO) layer between the at least one conductor and one of the diffused regions.

15. The ESD protection structure of claim 1, wherein one of the plurality of conductors is coupled to a positive power supply terminal or a ground terminal.

16. The ESD protection structure of claim 1, wherein one of the plurality of conductors is an electrically floating conductor.

* * * * *